(12) United States Patent
Leung et al.

(10) Patent No.: US 7,741,158 B2
(45) Date of Patent: Jun. 22, 2010

(54) METHOD OF MAKING THERMALLY ENHANCED SUBSTRATE-BASE PACKAGE

(75) Inventors: Timothy Leung, Singapore (SG); Mary Jean Bajacan Ramos, Alessandrea (SG); Gan Kian Yeow, Singapore (SG); Kyaw Ko Lwin, Singapore (SG); Romarico Santos San Antonio, Batam Island (ID); Anang Subagio, Batam Island (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 241 days.

(21) Appl. No.: 11/807,650

(22) Filed: May 30, 2007

(65) Prior Publication Data
US 2007/0284733 A1    Dec. 13, 2007

Related U.S. Application Data

(60) Provisional application No. 60/811,847, filed on Jun. 8, 2006.

(51) Int. Cl.
*H01L 21/00*    (2006.01)
*H01L 23/34*    (2006.01)
*H05K 7/20*     (2006.01)

(52) U.S. Cl. ............... 438/122; 438/460; 257/713; 257/717; 257/720; 361/709

(58) Field of Classification Search ............ None
See application file for complete search history.

(56) References Cited

U.S. PATENT DOCUMENTS

| | | | |
|---|---|---|---|
| 5,111,277 A | 5/1992 | Medeiros, III et al. | 357/74 |
| 5,442,230 A | 8/1995 | Chillara et al. | 257/666 |
| 5,559,306 A | 9/1996 | Mahulikar | 174/52.4 |
| 5,569,955 A | 10/1996 | Chillara et al. | 257/666 |
| 5,629,835 A | 5/1997 | Mahulikar et al. | 361/719 |
| 5,969,414 A | 10/1999 | Parthasarathi et al. | 257/675 |

(Continued)

OTHER PUBLICATIONS

Ibrahim et al., "Heat Spreader in Array Design to Minimize Processing Time", published in IP.com, Apr. 8, 2002.

(Continued)

*Primary Examiner*—Alonzo Chambliss
(74) *Attorney, Agent, or Firm*—Wiggin and Dana LLP (57) ABSTRACT

An array-type package encasing one or more semiconductor devices. The package includes a dielectric substrate having opposing first and second sides with a plurality of electrically conductive vias and a centrally disposed aperture extending from the first side to the second side. A heat slug has a mid portion extending through the aperture, a first portion adjacent the first side of the substrate with a cross sectional area larger than the cross sectional area of the aperture and an opposing second portion adjacent the second side of the substrate. One or more semiconductor devices are bonded to the first portion of the heat slug and electrically interconnected to the electrically conductive vias. A heat spreader having a first side and an opposing second side is spaced from the semiconductor devices and generally parallel with the heat slug, whereby the semiconductor devices are disposed between the heat spreader and the heat slug. A molding resin encapsulates the semiconductor devices and at least the first side of the substrate, the first portion of the heat slug and the first side of the heat spreader.

8 Claims, 6 Drawing Sheets

U.S. PATENT DOCUMENTS

| | | | |
|---|---|---|---|
| 5,977,626 A * | 11/1999 | Wang et al. | 257/707 |
| 6,262,477 B1 | 7/2001 | Mahulikar et al. | 257/698 |
| 6,963,142 B2 | 11/2005 | Bolken | 257/797 |
| 7,259,445 B2 * | 8/2007 | Lau et al. | 257/675 |
| 7,432,586 B2 * | 10/2008 | Zhao et al. | 257/685 |
| 2003/0057550 A1 | 3/2003 | Zhao et al. | |
| 2004/0159942 A1 | 8/2004 | Kinsman | |
| 2006/0091533 A1 | 5/2006 | Huang et al. | |

OTHER PUBLICATIONS

U.S. Appl. No. 11/670,650, filed Feb. 2007, Ramos et al.

* cited by examiner

METHOD OF MAKING THERMALLY ENHANCED SUBSTRATE-BASE PACKAGE

CROSS REFERENCE TO RELATED APPLICATION(S)

This patent application is claims priority to U.S. Provisional Patent Application Ser. No. 60/811,847 entitled "Method Of Making Thermally Enhanced Substrate-Based Package" that was filed on Jun. 8, 2006. Patent Application Ser. No. 60/811,847 is incorporated by reference in its entirety herein.

U.S. GOVERNMENT RIGHTS

N.A.

BACKGROUND OF THE INVENTION

1. Field of the Invention

This invention relates to packages to encase one or more semiconductor devices, and more particularly to a molded plastic ball grid array package have a substrate base and a heat slug.

2. Description of the Related Art

Enhancing the thermal performance of substrate-based packages for encasing semiconductor devices remains a challenge. Typical substrate-based packages such as land grid array and ball grid array packages typically extract heat through metallic vias. However, the small surface area of the vias limits the amount of heat that is dissipated. It is known to enhance the thermal dissipation of a surface mount package by brazing a heat sink to an aperture extending through the package base as disclosed in U.S. Pat. No. 5,111,277 to Medeiros et al. A package substrate including heat sink is also disclosed in U.S. Pat. No. 5,629,835 to Mahulikar et al. Both U.S. Pat. No. 5,111,277 and U.S. Pat. No. 5,629,835 are incorporated by reference in their entireties herein.

A method for enhancing the electrical properties of a molded plastic package by reducing self and mutual inductance is disclosed in U.S. Pat. No. 5,559,306 to Mahulikar. Parallel metallic plates are disposed within the package body with a semiconductor device disposed therebetween. U.S. Pat. No. 5,559,306 is incorporated by reference in its entirety herein.

There remains, however, a need for a substrate-based package with improved thermal dissipation that may be manufactured in large quantities at low cost.

BRIEF SUMMARY OF THE INVENTION

In accordance with a first embodiment of the invention, there is provided an array-type package to encase one or more semiconductor devices. The package includes a dielectric substrate having opposing first and second sides with a plurality of electrically conductive vias and a centrally disposed aperture extending from the first side to the second side. A heat slug has a mid-portion extending through the aperture, a first portion adjacent the first side of the substrate with a cross sectional area larger than the cross sectional area of the aperture and an opposing second portion adjacent the second side of the substrate. One or more semiconductor devices are bonded to the first portion of the heat slug and electrically interconnected to the electrically conductive vias. A heat spreader having a first side and an opposing second side is spaced from the semiconductor devices and generally parallel with the heat slug, whereby the semiconductor devices are disposed between the heat spreader and the heat slug. A molding resin encapsulates the semiconductor devices and at least the first side of the substrate, the first portion of the heat slug and the first side of the heat spreader.

In accordance with a second embodiment of the invention, there is provided a heat slug array that includes a dielectric substrate having opposing first and second sides and a plurality of apertures arranged in an array and a plurality of interconnected heat slugs. Each heat slug has a first portion and a second portion separated by a mid-portion wherein the mid-portion extends through one of the apertures and the first portion has a perimeter larger than the perimeter of the apertures.

In accordance with a third embodiment of the invention, there is provided a method for the manufacture of an array-type package for encasing one or more semiconductor devices. The method includes the steps of: (a). providing a heat slug array containing a dielectric substrate with a plurality of apertures and a plurality of interconnected heat slugs having opposing first and second portions separated by a mid-portion that extends through one of the apertures wherein the first portion has a perimeter larger than the perimeter of the apertures and multiple tie bars project from the perimeter of the first portion and where a tie bar from one heat slug intersects at least one other tie bar from an adjacent heat slug at an interconnection point; (b). bonding the semiconductor devices to the first portion and electrically interconnecting the semiconductor devices to electrically conductive vias on a first side of the dielectric substrate, the electrically conductive vias extending through the dielectric substrate to an opposing second side thereof; (c). providing an array of heat spreaders having multiple tie bars extending from a perimeter thereof wherein a tie bar from one heat spreader intersects at least one other tie bar from an adjacent heat spreader at an interconnection point; (d). bonding tie bars of the heat slugs to tie bars of the heat spreader such that the semiconductor devices are disposed between one of the heat slugs and one of the heat spreaders; and (e). encapsulating the semiconductor devices and at least a portion of the heat spreaders and heat slugs in a molding resin.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The details of one or more embodiments of the invention are set forth in the accompanying drawings and the description below. Other features, objects and advantages of the invention will be apparent from the description and drawings, and from the claims.

Like reference numbers and designations in the various drawings indicated like elements.

DETAILED DESCRIPTION

For this patent application, a "heat slug" or a "heat sink" is defined as a metallic component having a thermal conductivity greater than the thermal conductivity of a polymer molding resin and a maximum thickness greater than the thickness of a semiconductor device encapsulated in the molding resin. A "heat spreader" is defined as a metallic component having a thermal conductivity greater than the thermal conductivity of a polymer molding resin and a maximum thickness equivalent to or less than the thickness of a semiconductor device encapsulated in the molding resin.

Figure 1:
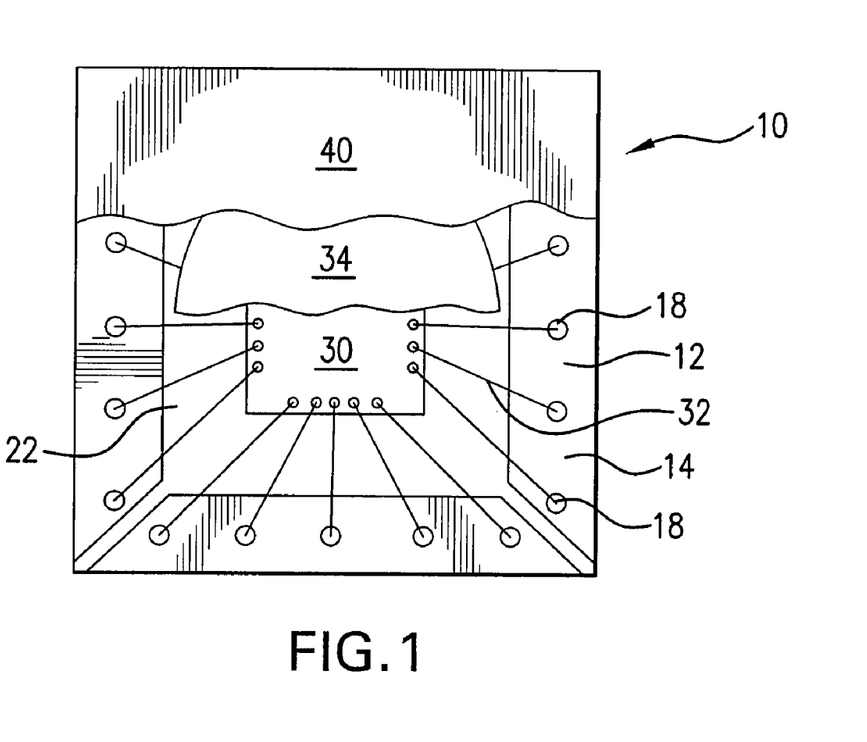
FIG. 1 is a top planar view, partially broken away, of the ball grid array package of the invention.
Figure 2:
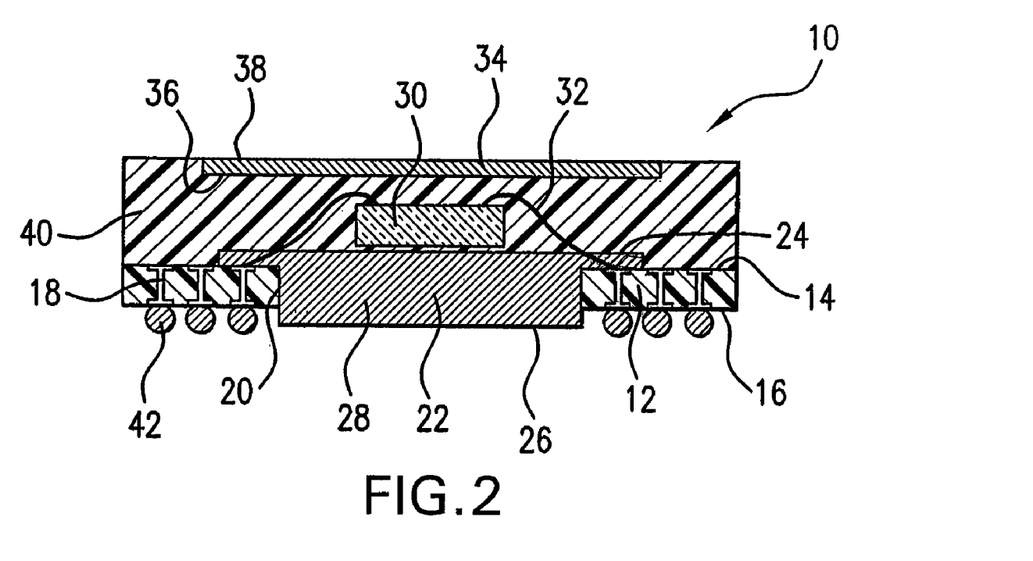
FIG. 2 is a cross-sectional view of the ball grid array package of FIG. 1

FIG. 1 shows in top planar view an array type package 10 in accordance with the invention. The package is partially broken away to illustrate the components of the package. FIG. 2 illustrates the array type package in cross-sectional representation. All array type packages disclosed herein may encapsulate one or more integrated circuit devices, such as silicon base integrated circuit devices, as well as one or more passive devices such as resistors, inductors and capacitors. Multiple devices may be in adjacent or stacked relationship.

Referring to FIGS. 1 and 2, a dielectric substrate 12 has opposing first 14 and second 16 sides. A plurality of electrically conductive vias 18 extend through the dielectric substrate 12. A centrally disposed aperture 20 also extends through the dielectric substrate 12. The aperture may be any shape, such as square, rectangular or circular and has a first perimeter.

A heat slug 22 is supported by the first side 14 of dielectric substrate 12. The heat slug 22 has a first portion 24 and opposing second portion 26 separated by mid-portion 28. The mid-portion 28 is sized to fit through the centrally disposed aperture 20, preferably with limited clearance. The first portion 24 has a perimeter larger than the perimeter of the centrally disposed aperture 20 forming a flange overlying the first surface 14.

One or more semiconductor devices 30 or a combination of semiconductor devices and passive devices, such as in a hybrid circuit, are bonded to the first portion 24 using a suitable die attach bonding material such as a lead- or gold-base solder or metal filled epoxy. The one of more semiconductor devices 30 are electrically interconnected to electrically conductive vias 18 through small diameter bond wires 32 or thin metallic foil strips as used in tape automated bonding.

A heat spreader 34 having first 36 and second 38 opposing sides is spaced apart from the one or more semiconductor devices 30 with the first side 36 being generally parallel with the first side 24 of heat slug 22. As illustrated in FIG. 2, first side 36 and first side 24 form adjacent sides of two parallel electrically conductive plates with the one or more semiconductor devices 30 disposed between the parallel plates.

A molding resin 40 encapsulates the one or more semiconductor devices 30, the first portion 24 of the heat slug 22 and the first side 36 of the heat spreader 34. The electrically conductive vias 18 adjacent to the second side 16 of the dielectric substrate 12 are electrically interconnected to circuit traces formed on external circuitry, such as a printed circuit board. Electrical interconnection may be by any suitable means including the use of solder balls 42. The solder balls are all substantially the same diameter such that a point opposite the second side 16 of each solder ball is generally coplanar with all the other points opposite the second side 16. The solder balls are typically formed from a low melting temperature lead-base solder such as, by weight, 63% tin/37% lead. Preferably, the second portion 26 of the heat slug 22 is also coplanar with the opposite points of the solder balls. The second portion may then be soldered to a heat sink or ground external to the package 10.

Figures 3, 4:
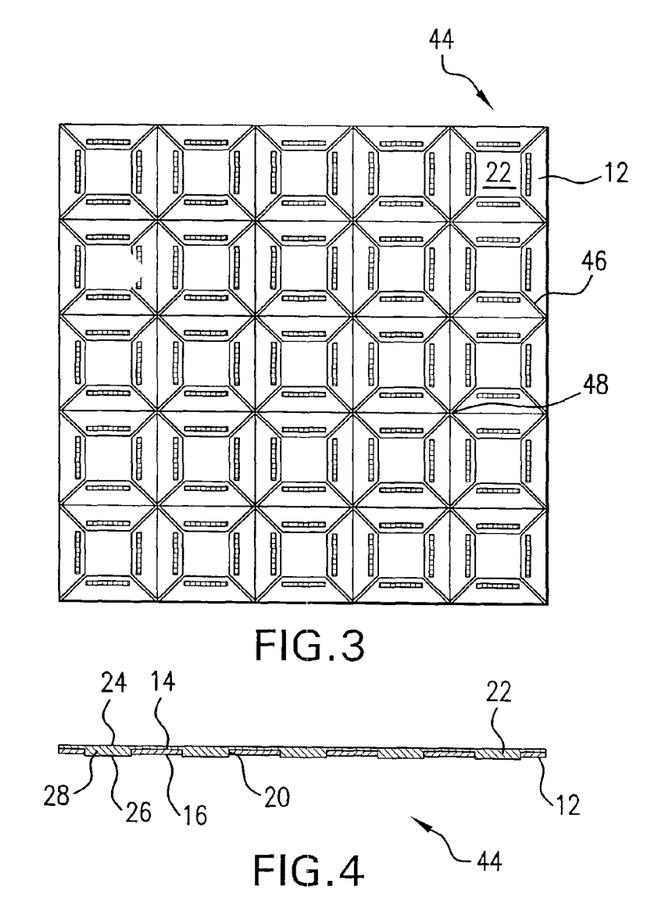
FIG. 3 is a top planar view of an array of substrates with heat slugs attached used in the manufacture of the package of the invention.
FIG. 4 is a cross-sectional view of the array of FIG. 3.
Figure 8:
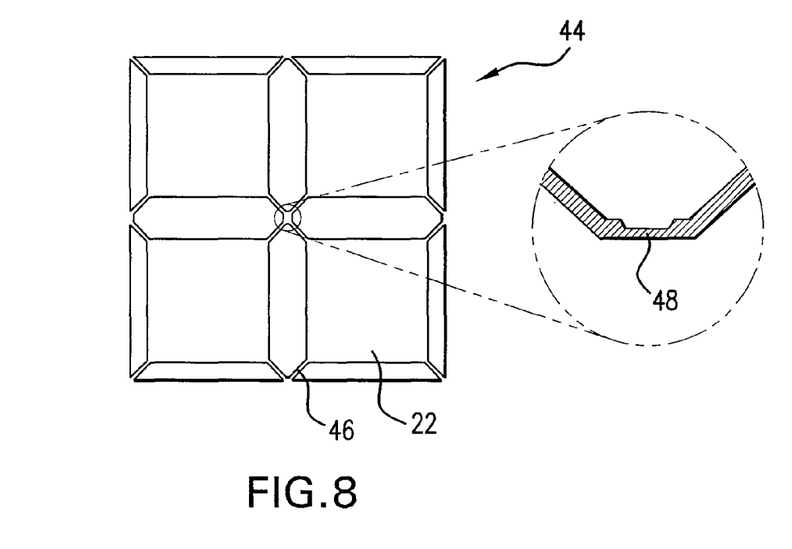
FIG. 8 illustrates a partial thinning of a portion of a heat slug tie bar to facilitate singulation.

FIGS. 3-6 illustrate components useful for the manufacture of the array type package. FIG. 3 shows in top planar view and FIG. 4 in cross-sectional view a heat slug array 44. The heat slug array 44 includes a plurality of heat slugs 22 each having a first portion 24 and second portion 26 separated by a midportion 28. The heat slug array 44 also includes dielectric substrate 12 having opposing first 14 and second 16 sides and centrally disposed apertures 20 extending therethrough. A mid-portion 26 of a heat slug 22 extends through each aperture 20. The first portion 16 has a perimeter larger than the perimeter of the apertures 20. Heat slug tie bars 46 project from the perimeters of the first portions 24 and tie bars from one heat slug intersect with at least one tie bar from an adjacent heat slug at an intersection point 48. As best seen in FIG. 8, the thickness of the tie bars 46 may be reduced at intersection points 48 to facilitate singulation.

Figure 5:
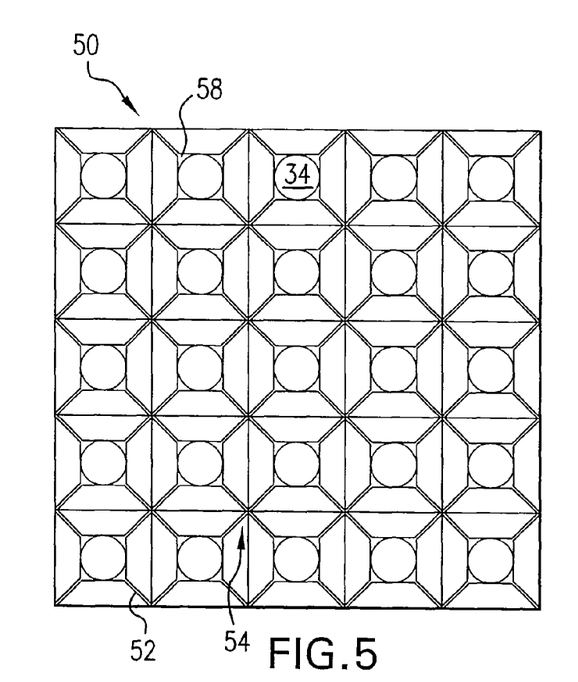
FIG. 5 is a top planar view of an array of heat spreaders used in the manufacture of the package of the invention.
Figure 6:
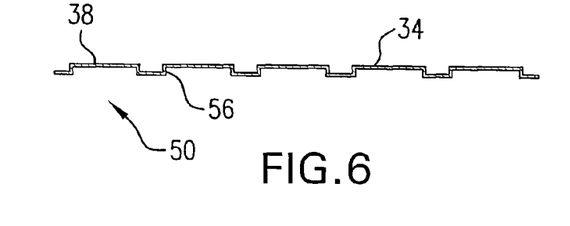
FIG. 6 is a cross-sectional view of the array of FIG. 5.

With reference back to FIG. 4, the heat slugs 22 are typically bonded to dielectric substrate 12 by an epoxy or an adhesive tape. The heat slugs are preferably formed from a thermally conductive metal such as a copper alloy and may be pre-plated with a wire bondable material such as a layer of gold or palladium over nickel. Referring to FIGS. 5 and 6, a heat spreader array 50 has multiple heat spreader tie bars 52 extending from the perimeter thereof. Tie bars from adjacent heat spreaders are joined together at tie bar intersection points 54 that may have a reduced thickness to facilitate singulation.

The tie bars generally include an upset portion 56 so that the second side 38 is raised a sufficient amount to be exposed following encapsulation with a molding resin and to provide standoff clearance for the wires used in wire bonding. The exposed second side 38 may be any shape including circular or square. The heat spreader is formed from any metal having high thermal conductivity such as copper, aluminum and their alloys. The metal may be coated with another material to enhance marking contrast. Most preferred is black anodization for an aluminum alloy heat spreader. Peripheral portions 58 of the heat spreader 34 may be partially etched to form a step-like configuration to improve mechanical locking into the molding resin.

Figure 7:
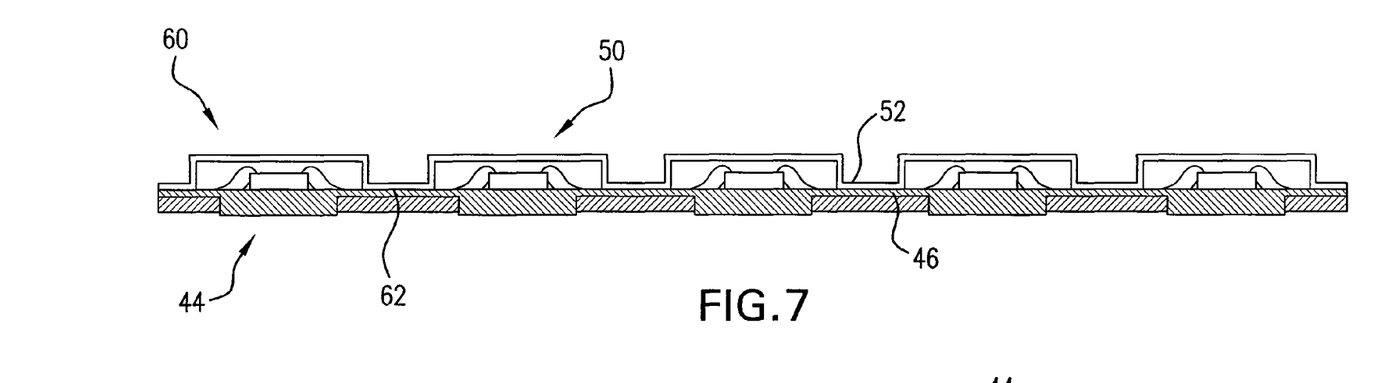
FIG. 7 shows in cross-sectional view an array of packages manufactured in accordance with the invention.

FIG. 7 illustrates in cross-sectional representation an array 60 of array type packages in accordance with the invention. Heat spreader array 50 is bonded to heat slug array 44 such as by an adhesive bond 62 bonding heat spreader tie bars 52 to heat slug tie bars 46. The array may then be singulated either before or after encapsulation with a molding resin.

Figure 9:
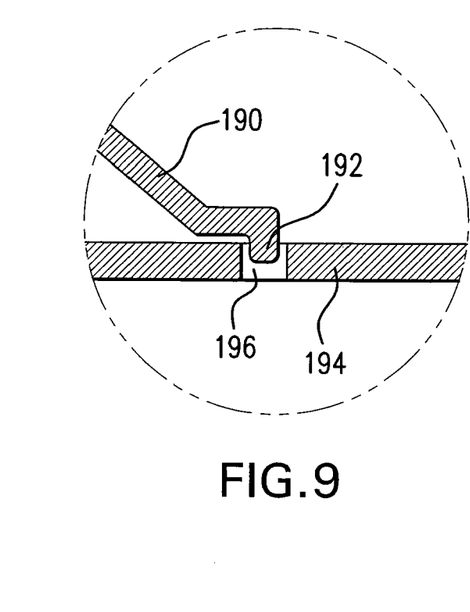
FIGS. 9-11 illustrate mechanisms for locking a heat spreader tie bar to a heat slug tie bar.
Figure 10:
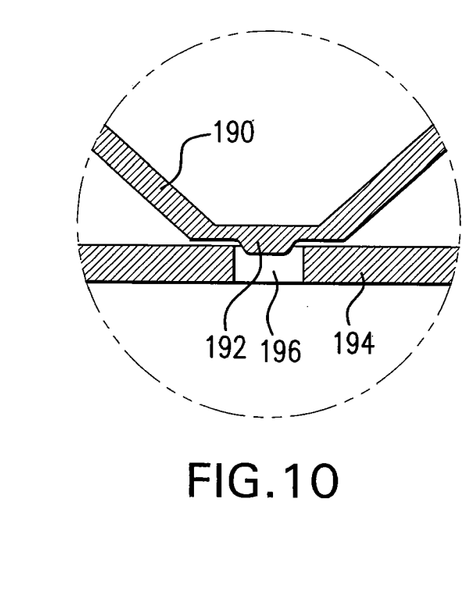
Figure 11:
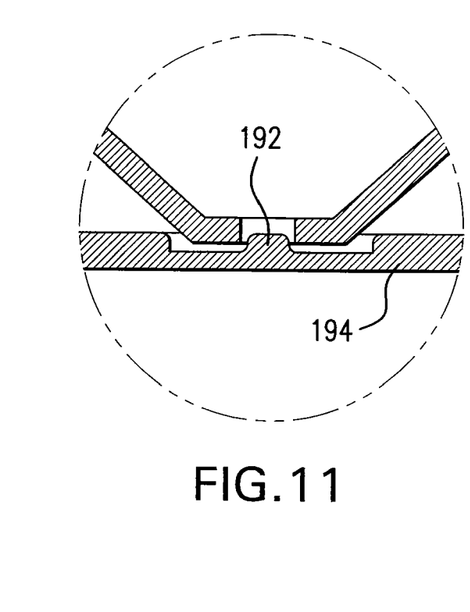

Referring to FIGS. 9-11, heat spreader tie bars 190 may have bumps 192 to enhance standoff clearance from the wires used for wire bonding. The bumps 192 are also useful to align and lock the heat spreader in position on heat slug tie bars 194. Apertures 196 may be formed in the heat slug tie bars 194 to further enhance alignment and lock-in. These bumps are typically formed during the chemical etching process or by coining/punching during the upset process. While the assembly process describes the array of heat slugs and the array of heat spreaders being molded together and subsequently singulated, it is within the scope of the invention for the heat spreaders and the heat slugs to be singulated prior to encapsulation with the molten resin and a pick and place process used to place individual heat slugs and individual heat spreaders in individual mold cavities for wire bonding and encapsulation.

Figure 12:
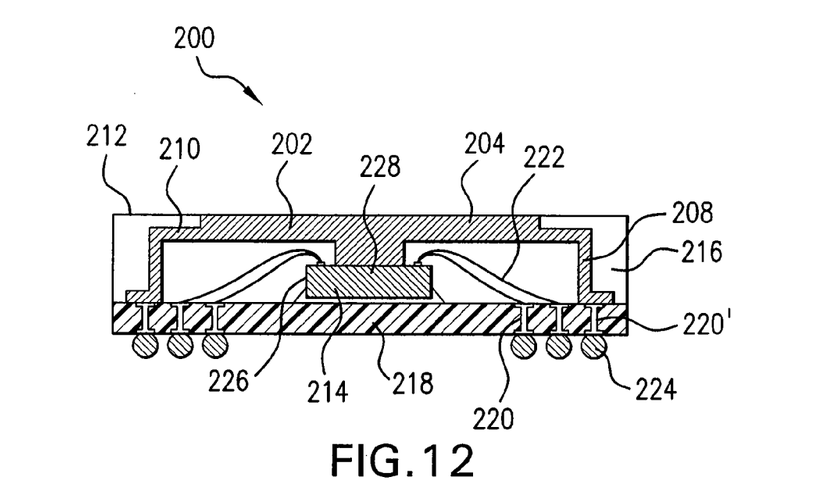
FIG. 12 illustrates a lead frame for use with a package in accordance with an embodiment of the invention.
Figure 13:
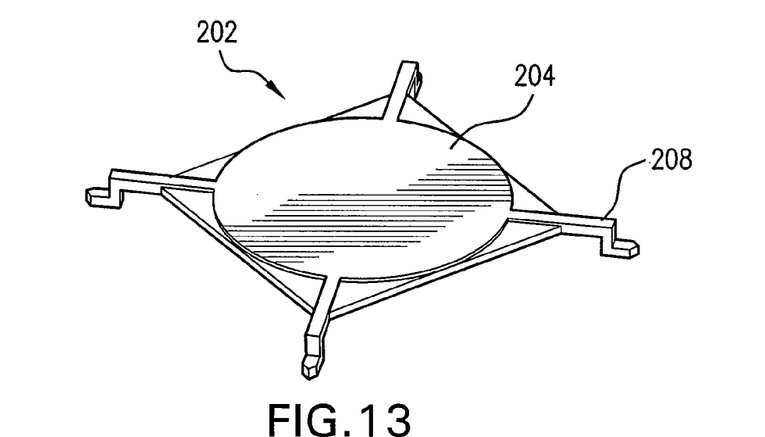
FIG. 13 is a top perspective view of the lead frame of FIG. 12.
Figure 14:
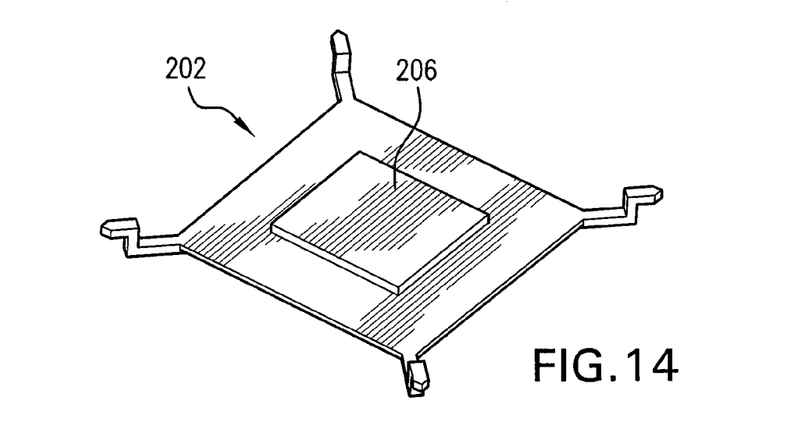
FIG. 14 is a bottom perspective view of the lead frame of FIG. 12.

FIG. 12 illustrates in cross-sectional representation an alternative embodiment of the invention in which the package 200 includes a heat slug 202 that functions as a lead frame. The lead frame 202 is illustrated in top perspective view in FIG. 13 and bottom perspective view in FIG. 14. The lead frame includes a surface-ward projecting portion 204 and a chip-ward projecting portion 206. In addition, the lead frame includes a plurality of tie bars 208 that typically project outwardly and then downwardly from corners of the lead frame. Referring back to FIG. 12, the lead frame 202 includes a reduced thickness portion 210 circumscribing at least a portion of the surface-ward projecting portion 204. Surface-ward projecting portion 204 forms a portion of a top surface 212 of the package 200 to facilitate the dissipation of heat. Because the lead frame 202 is formed from an electrically conductive material, the exposed surface-ward projecting portion 204 may also be used to conduct electrical signals to and from one or more integrated circuit devices 214 that are mounted on a central portion of dielectric substrate 218. A molding resin 216 encapsulates the one or more integrated circuit devices 214 and extends over the reduced thickness portion 210 effectively locking the lead frame 202 in place.

The requirements for lead frame 202 are similar to those for the heat spreader described herein above. The lead frame 202 is formed from an electrically conductive metal such as copper, a copper alloy, aluminum, an aluminum alloy or an iron/nickel base alloy as sometimes used in lead frames, for example alloy 42 (42% nickel-balance iron) or Kovar (an iron-nickel-cobalt alloy). Since the surface-ward projecting portion 204 is exposed to the environment, at least the exposed portion of the surface-ward projecting portion is coated with a corrosion resistant material. Preferably, the lead frame 202 is formed from a copper base alloy and the exposed portion of the surface-ward projecting portion 204 is coated with black oxide.

Other features of the lead frame 202 in common with the heat spreader described herein above are that the lead frame may be provided in a web-like form for array requirements. The surface-ward projecting portion 204 may be rounded or square, or any other desired shape depending on the need. Features may be etched into the lead frame and tie bars to enhance mold locking and alignment of the tie bars. The tie bars are preferably upset to elevate the surface-ward projecting portion and to avoid contacting the wires of a wire bonded package. Portions of the tie bars may be thinned for singulation ease and may have bumps to provide standup clearance from the wire bonds.

The lead frame may be formed from a copper alloy, aluminum alloy or other metal with high thermal conductivity. When formed from an aluminum-base alloy, it may be black anodized or have another coating to improve marking contrast. The lead frames may be provided in a matrix form or singulated for use in a pick and place process. Molding may be as individual packages or as a strip form.

The package 200 substrate 218 is formed from a dielectric material and may include a downwardly projecting heat slug as described above. A number of electrically conductive vias 220 extend through a peripheral portion of the substrate interconnecting wire or tab bonds 222 to solder balls 224. As illustrated, some of the electrically conductive vias provide a path for electrical communication with input/output (I/O) pads formed around the periphery 226 of the IC device 214. Others of the electrically conductive vias 220' form an electrical path between solders balls and the tie bars 208. Chipward projecting portion 206 may make electrical contact with a central portion 228 of the IC device 214. In this way, the lead frame 202 provides at least one, and alternatively both, of a path for thermal conduction and a path for electrical conduction. A thermally conductive grease or other thermal/electrical enhancing material may be disposed between the chipward projecting portion 206 and the central portion 228.

While FIG. 12 illustrates a wire bonded integrated circuit device 214, the electrically active face of the integrated circuit device 214 may be downwardly facing and electrically connected to the substrate 218 by flip chip bonding methods.

Figure 15A:
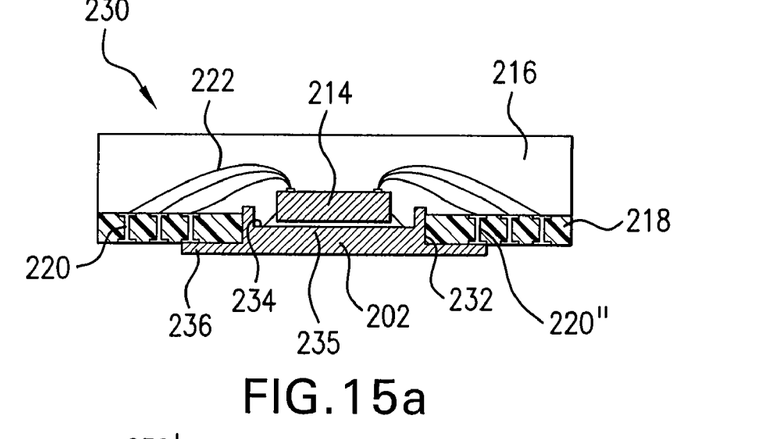
FIGS. 15a and 15b illustrate a lead frame for use with a package in accordance with another embodiment of the invention.

An alternative package 230 combining a lead frame 202 with a substrate 218 effective for use in ball grid array packages and land grid array packages is illustrated in cross-sectional representation in FIG. 15a. The lead frame 202 extends through centrally disposed aperture 232 in the substrate. Lead frame 202 is held in place by a conductive or non-conductive adhesive material between leadframe 202 and substrate 218. One or more integrated circuit devices 214 are mounted on a surface 234 of an upwardly projecting portion 235 of the lead frame 202. The integrated circuit device 214 is electrically interconnected to electrically conductive vias 220 by wire or tab bonds 222. The integrated circuit device is then encapsulated in molding resin 216.

Figure 15B:
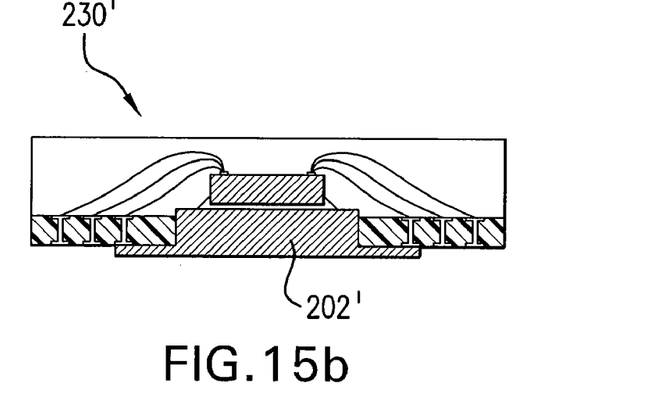

Certain of the electrically conductive vias 220" electrically interconnect input/output pads on the electrically active face of integrated circuit device 214 to external portions 236 or tie bars of the lead frame 202. A modified leadframe 202' for an alternative embodiment 230' of this package is illustrated in FIG. 15b.

Figure 16:
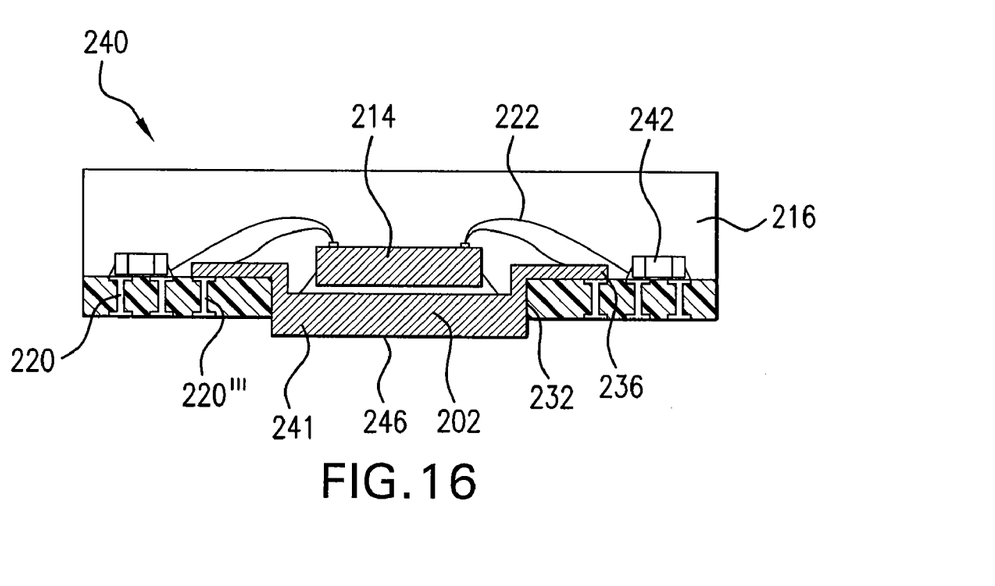
FIG. 16 illustrates a lead frame for use with a package in accordance with yet another embodiment of the invention.

Yet another alternative package 240 is illustrated in cross-sectional representation in FIG. 16. Lead frame 202 has a downwardly projecting portion 241 extending through centrally disposed aperture 232. One or more integrated circuit devices 214, optionally in combination with passive devices 242, are mounted on a centrally disposed portion 244 of the lead frame 202 to reduce the overall height of the package 240. Wire or tab bonds 222 electrically interconnect I/O pads on integrated circuit device 214 or passive device 242 to external circuitry such as on a printed circuit board. Selected ones 220''' of the electrically conductive vias electrically interconnect external portions 236 of the lead frame 202 to external circuitry. As with previous embodiments, integrated circuit device 214 and optional passive devices 242 are then encapsulated with molding resin 216.

Surface 246 of the downwardly projecting portion 241 of the lead frame 202 provides a large surface area for the dissipation of heat. While all the packages disclosed herein have improved thermal dissipation characteristics as compared to conventional BGA and LGA packages, as illustrated by the Examples below, the package 240 of FIG. 16 very greatly enhances thermal dissipation. For even better thermal properties, the surface 246 may be thermally coupled to an external heat sink or heat spreader or exposed to a cooling fluid. Surface 246 may also function as a stop to control the dimensions of solder balls bonded to electrically conductive vias 220''' following melting for attachment to external circuitry.

The advantages of the invention will become more apparent from the examples that follow.

EXAMPLES

Example 1

The package of FIG. 12 was modeled for thermal performance by computer simulation of a 169 ball 8×8 BGA (FBGA) package having the dimensions and specifications of Table 1. $\Theta_{JA}$ is the thermal resistance from the operation portion of a semiconductor device to a still air environment surrounding the device. As shown in Table 2, the simulated $\Theta_{JA}$ improved by about 2° C./W. This improvement means a 7.9% improvement in power dissipation.

TABLE 1

| Package Type | FBGA |
|---|---|
| Package Size | 8 × 8 × 0.7 mm |
| Die Size | 4.98 × 4.8 × 0.25 mm |
| Ball matrix | 13 × 13 |
| No. of balls | 169 balls |
| Ball pitch | 0.5 mm |
| Cavity orientation | UP |
| Substrate | 2 layers (0.2 mm Thickness) |
| No. of Thermal Vias in PCB | 81 |

TABLE 2

| Still Air | Without lead frame | With lead frame |
|---|---|---|
| $\Theta_{JA}$ (° C./W) | 27.04 | 25.05 |
| $\Theta_{JA}$ Improvement | N.A. | 1.99 |
| Power Improvement (W/W) | N.A. | 0.0794 |

Example 2

The packages of FIGS. 15 and 16 were modeled for thermal performance by computer simulation FBGA packages having the dimensions and specifications of Table 3. The calculated thermal performance of these simulated packages is reported in Table 4.

TABLE 3

| Package Type | FBGA |
|---|---|
| Package Size | 8 × 8 × 0.7 mm |
| Die Size | 4.98 × 4.8 × 0.25 mm |
| Ball matrix | 13 × 13 |
| No. of balls | 169 balls |
| Ball pitch | 0.5 mm |
| Cavity orientation | UP |
| Substrate | 2 layers (0.2 mm Thickness) |
| No. of Thermal Vias in PCB | 81 |

TABLE 4

| Still Air | Without lead frame | With lead frame on the substrate (FIG. 16) | With lead below the substrate (FIG. 15) |
|---|---|---|---|
| $\Theta_{JA}$ (° C./W) | 27.04 | 24.05 | 24.69 |
| $\Theta_{JA}$ Improvement | N.A. | 2.99 | 2.35 |
| Power Improvement (W/W) | N.A. | 0.1243 | 0.0952 |

Table 4 illustrates the package of FIG. 15 has a $\Theta_{JA}$ improvement of about 2.4° C./W while the package of FIG. 16 has a $\Theta_{JA}$ improvement of almost 3° C./W. Because of the smaller centrally disposed aperture, as compared to the package of FIG. 15, this package can maintain more signal I/Os. Referring back to FIG. 2, the mid-portion 28 can be made smaller and the centrally disposed aperture is smaller so that the package can maintain more signal I/Os on substrate 12. In addition, the lead frame can be used as the ground plane as well as thermal paths.

One or more embodiments of the present invention have been described. Nevertheless, it will be understood that various modifications may be made without departing from the spirit and scope of the invention.

What is claimed is:

1. A method for the manufacture of an array-type package for encasing one or more semiconductor devices comprising the steps of:
   a) providing a heat slug array containing a dielectric substrate with a plurality of apertures and a plurality of interconnected heat slugs having opposing first and second portions separated by a mid-portion that extends through one of said plurality of apertures wherein said first portion has a perimeter larger than the perimeter of said one of said plurality of apertures, multiple tie bars projecting from said perimeter wherein a tie bar from one said heat slug intersects at least one other tie bar from an adjacent heat slug at an interconnection point;
   b) bonding said one or more semiconductor devices to said first portion and electrically interconnecting said one or more semiconductor devices to electrically conductive vias on a first side of said dielectric substrate, said electrically conductive vias extending through said dielectric substrate to an opposing second side thereof;
   c) providing an array of heat spreaders having multiple tie bars extending from a perimeter thereof wherein a tie bar from one said heat spreader intersects at least one other tie bar from an adjacent heat spreader at an interconnection point;
   d) bonding tie bars of said heat slugs to tie bars of said heat spreader such that said one or more semiconductor devices are disposed between one of said heat slugs and one of said heat spreaders;
   e) encapsulating said one or more semiconductor devices and at least a portion of said heat spreaders and heat slugs in a molding resin; and
   singulating the array into individual components.

2. The method of claim 1 wherein said step of singulating is between the steps of (a) providing a heat slug array and (b) bonding said one or more semiconductor devices.

3. The method of claim 1 wherein said step of singulating is after the step of (e) encapsulating.

4. The method of claim 1 wherein said tie bars of said heat slugs and said tie bars of said heat spreaders are provided with features to facilitate alignment and bonding.

5. The method of claim 4 wherein one of said heat slugs and said heat spreaders is provided with projections and the other with mating apertures.

6. The method of claim 1 including the step of attaching solder balls to said electrically conductive vias on said second side.

7. The method of claim 6 wherein said solder balls are selected to have a diameter effective for a point on said solder balls opposite said second side to be coplanar with said second portion of said heat slug.

8. The method of claim 7 including the step of bonding both said solder balls and said second portion to an external circuit.

* * * * *